US010777159B2

(12) United States Patent
Takeuchi et al.

(10) Patent No.: US 10,777,159 B2
(45) Date of Patent: Sep. 15, 2020

(54) GATE DRIVER AND DISPLAY APPARATUS HAVING THE SAME

(71) Applicant: Samsung Display Co., Ltd., Yongin-Si, Gyeonggi-Do (KR)

(72) Inventors: Noboru Takeuchi, Asan-si (KR); Masami Igawa, Suwon-si (KR); Min soo Kang, Asan-si (KR); Beomjun Kim, Seoul (KR); YoonHo Kim, Asan-si (KR); Seongyeol Syn, Asan-si (KR); Hong-Woo Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 129 days.

(21) Appl. No.: 15/805,754

(22) Filed: Nov. 7, 2017

(65) Prior Publication Data

US 2018/0061353 A1 Mar. 1, 2018

Related U.S. Application Data

(63) Continuation of application No. 14/755,769, filed on Jun. 30, 2015, now abandoned.

(30) Foreign Application Priority Data

Dec. 26, 2014 (KR) .................... 10-2014-0190594

(51) Int. Cl.
 *G09G 3/36* (2006.01)
 *G11C 19/28* (2006.01)
(52) U.S. Cl.
 CPC ........... *G09G 3/3677* (2013.01); *G11C 19/28* (2013.01); *G09G 2310/0267* (2013.01); *G09G 2310/0286* (2013.01)

(58) Field of Classification Search
 CPC ......... G09G 2310/0286; G09G 3/3677; G09G 2310/0267; G09G 3/36; G11C 19/28
 See application file for complete search history.

(56) References Cited

U.S. PATENT DOCUMENTS

2008/0111801 A1 5/2008 Hsu
2008/0266275 A1 10/2008 Tsai et al.
(Continued)

FOREIGN PATENT DOCUMENTS

JP 2009217187 A 9/2009
KR 1020130141097 A 12/2013
(Continued)

OTHER PUBLICATIONS

Yoshida, et al., Flexible Flat-Panel Display Designs with Gate Driver Circuits Integrated within the Pixel Area, SID 2014 Digest, vol. 49.1, pp. 701-704.
(Continued)

*Primary Examiner* — Jeff Piziali
(74) *Attorney, Agent, or Firm* — Cantor Colburn LLP

(57) ABSTRACT

Each stage of a gate driver includes a controlling part which increases an electric potential of a boosting line in response to a carry signal of a previous stage and decreases the electric potential of the boosting line in response to the carry signal of a next stage, a first output part which turns on in response to the increased electric potential of the boosting line and receiving a clock signal to output a gate signal of a present stage, and a second output part which turns on in response to the increased electric potential of the boosting line and receiving the clock signal to output the carry signal of the present stage. The boosting line of the present stage is disposed adjacent to a gate line which is connected to one of next stages following the present stage.

19 Claims, 5 Drawing Sheets

(56) References Cited

U.S. PATENT DOCUMENTS

| | | | |
|---|---|---|---|
| 2009/0021502 A1 | 1/2009 | Lee et al. | |
| 2009/0167668 A1 | 7/2009 | Kim | |
| 2010/0085294 A1* | 4/2010 | Otose | G09G 3/3677 345/100 |
| 2010/0277206 A1* | 11/2010 | Lee | G09G 3/3677 327/108 |
| 2011/0142191 A1* | 6/2011 | Tobita | G11C 19/184 377/64 |
| 2011/0148830 A1* | 6/2011 | Hsu | G09G 3/3266 345/205 |
| 2011/0182399 A1* | 7/2011 | Tobita | G09G 3/3677 377/70 |
| 2011/0273417 A1* | 11/2011 | Shin | G09G 3/20 345/211 |
| 2012/0194773 A1* | 8/2012 | Kim | G02F 1/13336 349/139 |
| 2013/0033468 A1* | 2/2013 | Takahashi | G09G 3/20 345/204 |
| 2013/0100007 A1* | 4/2013 | Yamamoto | G09G 3/3677 345/100 |
| 2013/0106677 A1* | 5/2013 | Koo | G11C 19/28 345/87 |
| 2013/0222357 A1 | 8/2013 | Tseng et al. | |
| 2013/0321499 A1* | 12/2013 | Park | G09G 3/20 345/698 |
| 2015/0293546 A1* | 10/2015 | Tanaka | H03K 17/04206 327/541 |

FOREIGN PATENT DOCUMENTS

| | | |
|---|---|---|
| KR | 1020140008211 A | 1/2014 |
| WO | 2014069529 A1 | 5/2014 |
| WO | 2014073486 A1 | 5/2014 |

OTHER PUBLICATIONS

Dictionary.com, "adjacent," in Dictionary.com Unabridged. Source location: Random House, Inc. http://dictionary.reference.com/browse/adjacent, Nov. 18, 2011, p. 1.

* cited by examiner

GATE DRIVER AND DISPLAY APPARATUS HAVING THE SAME

This application is a continuation of U.S. patent application Ser. No. 14/755,769, filed on Jun. 30, 2015, which claims priority to Korean Patent Application No. 10-2014-0190594, filed on Dec. 26, 2014, and all the benefits accruing therefrom under 35 U.S.C. § 119, the contents of which in their entirety are herein incorporated by reference.

BACKGROUND

1. Field

The invention relates to a display apparatus. More particularly, the invention relates to a gate driver and a display apparatus having the gate driver.

2. Description of the Related Art

In general, a display apparatus usually includes a display panel that includes pixels which displays an image, a gate driver which applies gate signals to the pixels, and a data driver which applies data voltages to the pixels.

The gate driver generates gate signals and applies the gate signals to the pixels. The data driver generates data voltages and applies the data voltages to the pixels. The pixels receive the data voltages in response to the gate signals and display an image which corresponds to the data voltages.

The display panel includes a display area in which the pixels are disposed and a non-display area which surrounds the display area. The gate driver is disposed on the non-display area. In general, the non-display area is called a bezel area. To dispose the gate driver on the display panel, a separate area is needed on the display panel, and as a result realizing a narrow bezel on the display panel may be difficult.

SUMMARY

The invention provides a gate driver capable of realizing a narrow bezel and displaying a normal image.

The invention provides a display apparatus having the gate driver.

Exemplary embodiments of the invention provide a gate driver which includes a plurality of stages connected to each other one after another and connected to gate lines to output gate signals. Each of the stages includes a controlling part which increases an electric potential of a boosting line in response to a carry signal of a previous stage and decreases the electric potential of the boosting line in response to the carry signal of a next stage, a first output part which turns on in response to the increased electric potential of the boosting line and receives a clock signal to output the gate signal of a present stage, and a second output part which turns on in response to the increased electric potential of the boosting line and receiving the clock signal to output the carry signal of the present stage. The boosting line of the present stage is disposed adjacent to the gate line connected to one of next stages following the present stage.

The controlling part of a first stage of the plurality of stages is applied with a start signal to increase the electric potential of the boosting line.

The boosting line of the present stage is disposed to be adjacent to the gate line which is connected to the next stage.

The gate driver further includes a plurality of carry lines disposed to correspond to the gate lines in a one-to-one correspondence to output the carry signal from one stage to the next stage.

The carry lines are substantially extended in parallel to the gate lines.

The boosting line of the present stage is disposed between the gate line which is connected to the next stage and the carry line of the next stage.

The boosting line of the present stage is disposed under the carry line of the next stage.

The gate driver further includes a first pull-down part which decreases an electric potential of an output terminal of the each stage, wherein the output terminal outputs the gate signal of the present stage to a first voltage in response to the gate signal of the next stage, a second pull-down part which decreases an electric potential of a carry terminal of the each stage, wherein the carry terminal outputs the carry signal of the present stage to a second voltage, which is lower than the first voltage, in response to the gate signal of the next stage, a holding part which holds the gate signal of the present stage to the first voltage and holds the carry signal of the present stage to the second voltage during a turn-off period of the first output part, a switching part which controls an on/off operation of the holding part, and a stabilizing part which stabilizes the electric potential of the boosting line during a low period of the gate signal of the present stage.

The plurality of stages of the gate driver are connected to a plurality of lines which receives the first voltage, the second voltage, and the clock signal, wherein the plurality of lines extends in a direction which crosses a direction in which the gate lines extend.

Embodiments of the invention provide a display apparatus including a display panel which includes a display area, in which pixels are disposed on and connected to gate lines and data lines, which cross the gate lines, and a non-display area surrounding the display area, and a gate driver which includes a plurality of stages which is connected to each other one after another, connected to the gate lines to output gate signals, and disposed on the display area. Each of the stages includes a controlling part which increases an electric potential of a boosting line in response to a carry signal of a previous stage and decreases the electric potential of the boosting line in response to the carry signal of a next stage, a first output part which turns on in response to the increased electric potential of the boosting line and receiving a clock signal to output the gate signal of a present stage, and a second output part which turns on in response to the increased electric potential of the boosting line and receives the clock signal to output the carry signal of the present stage. The boosting line of the present stage is disposed adjacent to the gate line connected to one of next stages following the present stage, and the controlling part of a first stage of the plurality of stages is applied with a start signal to increase the electric potential of the boosting line.

According to the above, the narrow bezel of the display apparatus is realized and the image is normally displayed in the display apparatus.

BRIEF DESCRIPTION OF THE DRAWINGS

The above and other features of the invention will become readily apparent by reference to the following detailed description when considered in conjunction with the accompanying drawings, in which.

DETAILED DESCRIPTION

Figure 1:
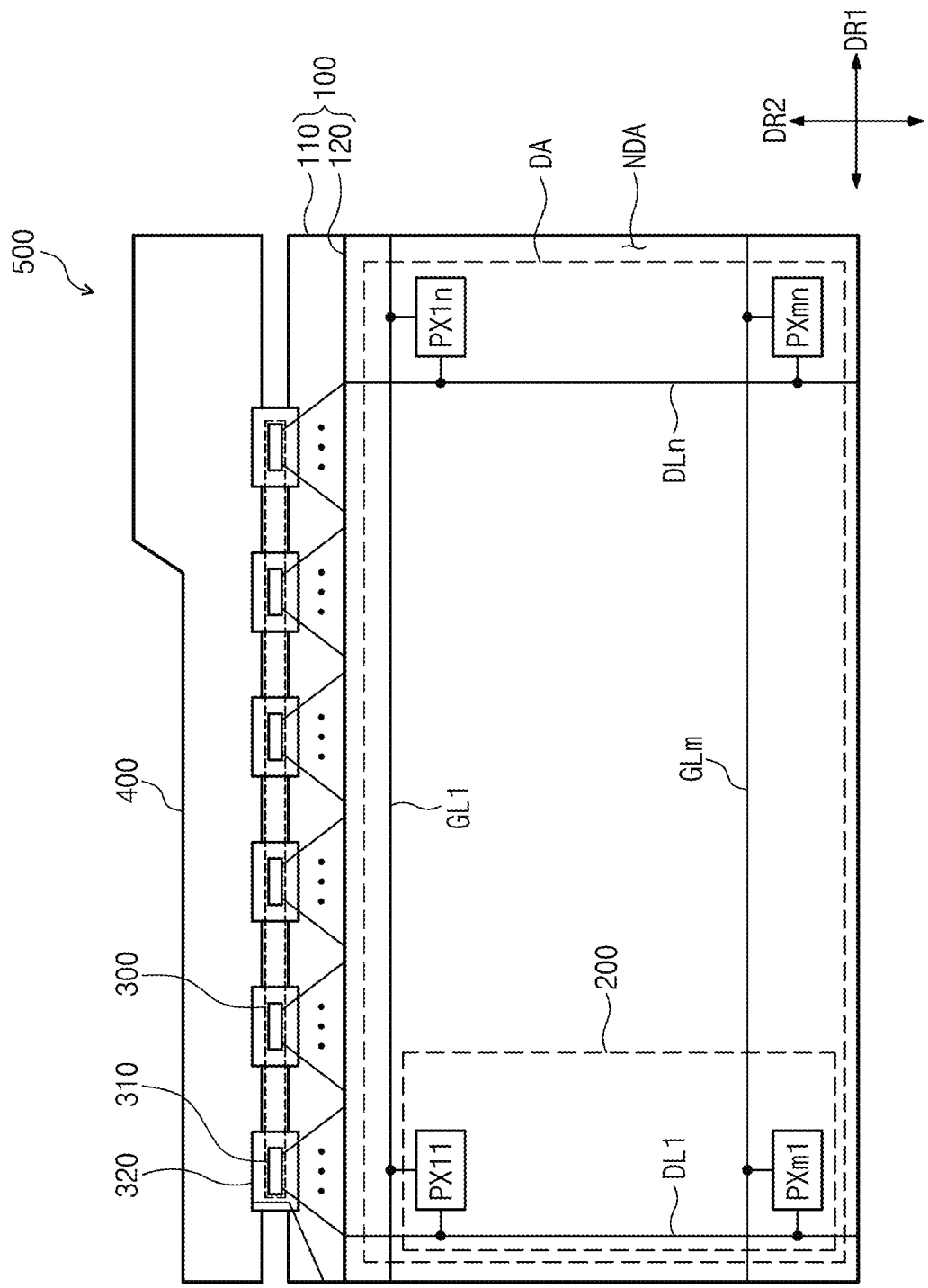
FIG. 1 is a plan view showing an exemplary embodiment of a display apparatus according to an the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a plan view showing exemplary embodiment of a display apparatus 500 according to the invention.

Referring to FIG. 1, an exemplary embodiment of the display apparatus 500 includes a display panel 100, a gate driver 200, a data driver 300, and a printed circuit board 400.

In an exemplary embodiment, the display panel 100 may be, but not limited to, a liquid crystal display panel including a liquid crystal layer. The display panel 100 includes a first substrate 110, a second substrate 120 facing the first substrate 110, and the liquid crystal layer interposed between the first and second substrates 110 and 120.

The display panel 100 includes a plurality of gate lines GL1 to GLm, a plurality of data lines DL1 to DLn, and a plurality of pixels PX11 to PXmn. Here, "m" and "n" are constant numbers greater than 0. In addition, the display panel 100 includes a display area DA which displays an image and a non-display area NDA which surrounds the display area DA and does not display an image when viewed.

The gate lines GL1 to GLm and the data lines DL1 to DLn are disposed on the first substrate 110. The gate lines GL1 to GLm are insulated from the data lines DL1 to DLn when they cross each other.

The gate lines GL1 to GLm extend in a first direction DR1 and are connected to the gate driver 200. The data lines DL1 to DLn extend in a second direction DR2, which crosses the first direction DR1, and are connected to the data driver 300.

The first direction DR1 corresponds to a row and the second direction DR2 corresponds to a column.

The pixels PX11 to PXmn are arranged in a matrix configuration and disposed on the display area DA. In one exemplary embodiment, for instance, the pixels PX11 to PXmn are arranged in areas defined by where the gate lines GL1 to GLm intersect with the data lines DL1 to DLn but the invention is not limited thereto. As a result, the pixels PX11 to PXmn are arranged in m rows by n columns.

Each of the pixels PX11 to PXmn are connected to a corresponding gate line of the gate lines GL1 to GLm and a corresponding data line of the data lines DL1 to DLn. Each of the pixels PX11 to PXmn displays one primary color. The primary colors may include red, green, blue and white, but are not limited thereto. In an exemplary embodiment, the primary colors may further include various colors, such as yellow, cyan and magenta.

The gate driver 200 may be disposed on the display area DA of the display panel 100. In an exemplary embodiment, the gate driver 200 may be disposed at a predetermined area on one side of the display area DA in the first direction DR1. As a result, the gate driver 200 may be positioned overlapping with the pixels disposed at that predetermined area.

In an exemplary embodiment, the gate driver 200 may be disposed at various positions on the display area DA. When the gate driver 200 is disposed on the display area DA, a narrow bezel may be realized. Details on the structure of the gate driver 200 will be described later.

The gate driver 200 includes a plurality of transistors connected to each other to output the gate signals. The transistors of the gate driver 200 are mounted on the first substrate 110. The transistors of the gate driver 200 are substantially and simultaneously formed together with transistors of the pixels PX11 to PXmn disposed on the display area DA by using the same process.

In an exemplary embodiment the gate driver 200 may be mounted on the first substrate 110 of the display panel 100 with an amorphous silicon thin film transistor ("TFT") gate driver circuit ("ASG"). In an exemplary embodiment, the transistors of the gate driver 200 may include an amorphous silicon thin film transistor.

In an exemplary embodiment, the gate driver 200 may be mounted on the first substrate 110 of the display panel 100 with an oxide silicon TFT gate driver circuit ("OSG"). In an exemplary embodiment, the transistors of the gate driver 200 may include an oxide thin film transistor having an oxide semiconductor.

The gate driver 200 receives a gate control signal from a timing controller (not shown) mounted on the printed circuit board 400. Although not shown in figures, in an exemplary embodiment, the timing controller may be mounted on the printed circuit board 400 in the form of an integrated circuit chip and connected to the gate driver 200 and the data driver 300.

The gate driver 200 generates gate signals in response to the gate control signal. The gate signals are outputted sequentially. The gate signals are applied to the pixels PX11 to PXmn through the gate lines GL1 to GLm one row at a time. As a result, the pixels PX11 to PXmn are driven one row at a time.

In an exemplary embodiment, the data driver 300 includes a plurality of source driving chips 310. The source driving chips 310 are mounted on flexible circuit boards 320. The flexible circuit boards 320 are connected between the printed circuit board 400 and the first substrate 100 of the non-display area NDA, adjacent to the upper side of the display area DA. In an exemplary embodiment, the data driver 300 is connected to the display panel 100 in a tape carrier package ("TCP") manner.

In an another exemplary embodiment, the data driver 300 may be formed with a plurality of driving chips and mounted on the first substrate 110 of the display panel 100 in a chip-on-glass ("COG") manner.

The data driver 300 receives image signals and a data control signal from the timing controller. The data driver 300 generates analog data voltages form corresponding image signals in response to a data control signal. The data voltages are applied to the pixels PX11 to PXmn through the data lines DL1 to DLn.

The pixels PX11 to PXmn receive the data voltages through the data lines DL1 to DLn in response to the gate signals provided through the gate lines GL1 to GLm. The pixels PX11 to PXmn display grayscales which correspond to the data voltages. As a result, the desired image is displayed.

Figure 2:
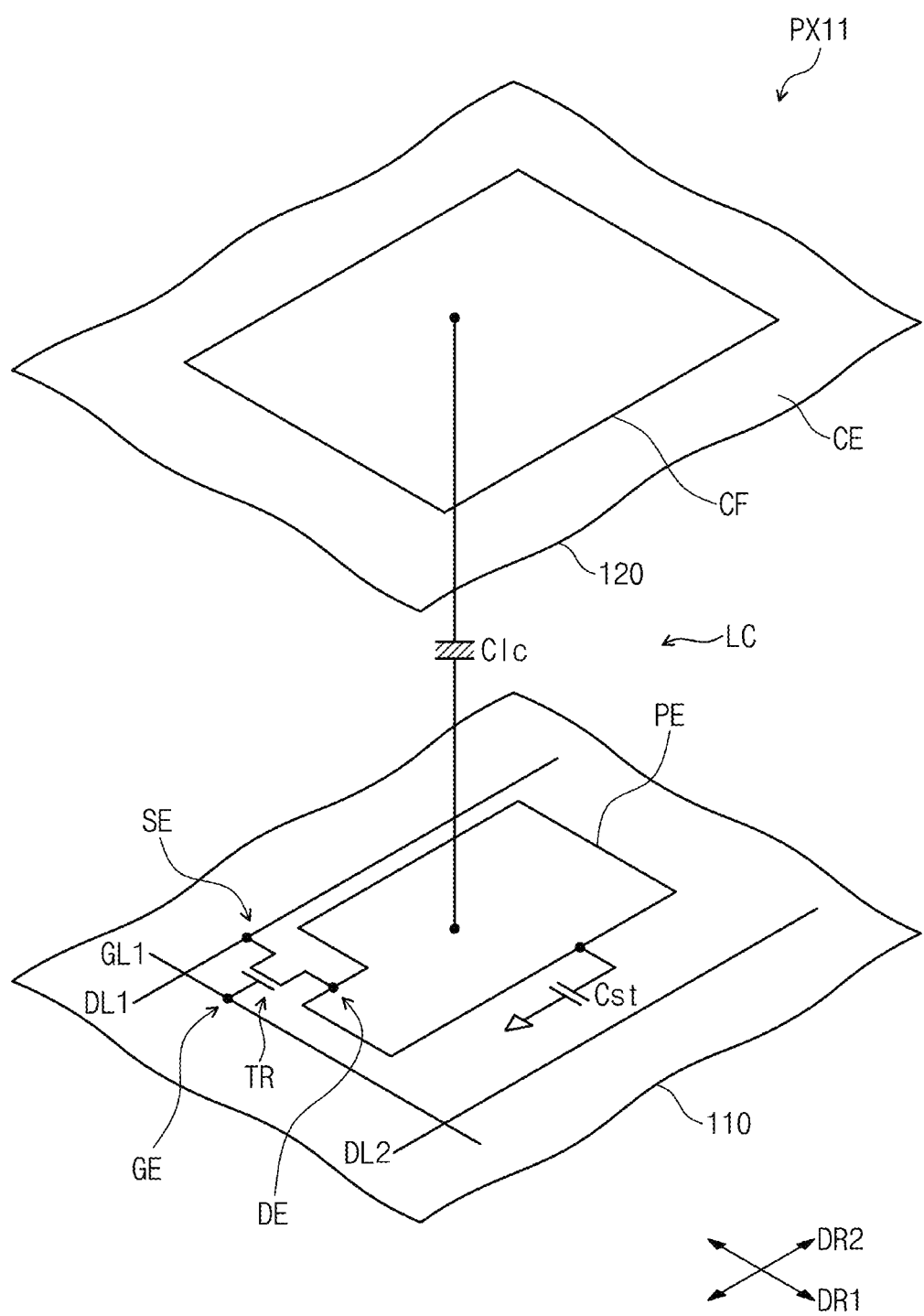
FIG. 2 is an equivalent circuit diagram showing an exemplary embodiment of one pixel shown in FIG. 1.

FIG. 2 is an equivalent circuit diagram showing one pixel shown in FIG. 1.

For the convenience of explanation, FIG. 2 shows an exemplary embodiment of only one pixel PX11 connected to a first gate line GL1 and a first data line DL1. Although not shown in figures, the other pixels PX11 to PXmn have the same structure as that of the pixel PX11 shown in FIG. 2.

Referring to FIG. 2, the display panel 100 includes the first substrate 110, the second substrate 120 facing the first substrate 110, and a liquid crystal layer LC interposed between the first substrate 110 and the second substrate 120.

In an exemplary embodiment, the pixel PX11 includes a transistor TR connected to the first gate line GL1 and the first data line DL1, a liquid crystal capacitor Clc connected to the transistor TR, and a storage capacitor Cst connected to the liquid crystal capacitor Clc in series. In another exemplary embodiment, the storage capacitor Cst may be omitted.

The transistor TR includes a gate electrode GE connected to the first gate line GL1, a source electrode SE connected to the first data line DL1, and a drain electrode DE connected to the liquid crystal capacitor Clc and the storage capacitor Cst.

The liquid crystal capacitor Clc includes a pixel electrode PE disposed on the first substrate 110, a common electrode CE disposed on the second substrate 120, and the liquid crystal layer LC is interposed between the pixel electrode PE and the common electrode CE. The liquid crystal layer LC serves as a dielectric substance. The pixel electrode PE is connected to the drain electrode DE of the transistor TR.

In FIG. 2, the pixel electrode PE does not include slits defined therein. However, in another exemplary embodiment the pixel electrode PE may include slits defined therein, e.g., a trunk portion having a cross shape and a plurality of branch portions extending from the trunk portion in a radial shape to define the slits.

In an exemplary embodiment, the common electrode CE is may be entirely formed on the surface of the second substrate 120, but is not limited thereto or thereby. In an exemplary embodiment, at least one of the pixel electrode PE and the common electrode CE may include slits defined therein.

The storage capacitor Cst includes the pixel electrode PE, a storage electrode (not shown) branched from a storage line (not shown), and an insulating layer interposed between the pixel electrode PE and the storage electrode. The storage line is disposed on the first substrate 110 and substantially and simultaneously formed together with the gate lines GL1 to GLm to be in a same layer among those disposed on the first substrate 110. The storage electrode may partially overlap with the pixel electrode PE.

In an exemplary embodiment, the pixel PX further includes a color filter CF which displays one of the primary colors. As an example, the color filter CF may be disposed on the second substrate 120 as shown in FIG. 2, but should not be limited thereto or thereby. In an exemplary embodiment, the color filter CF may be disposed on the first substrate 110.

The transistor TR is turned on in response to the gate signal which is provided through the first gate line GL1. The data voltage, which is provided through the first data line DL1, is applied to the pixel electrode PE of the liquid crystal capacitor Clc through the turned-on transistor TR. A common voltage is applied to the common electrode CE.

An electric field is formed between the pixel electrode PE and the common electrode CE by the difference in voltage between the data voltage and the common voltage. Liquid crystal molecules of the liquid crystal layer LC are driven by the electric field, which is formed between the pixel electrode PE and the common electrode CE. The liquid crystal molecules, which are driven by the electric field, control the transmittance of light which passes through the liquid crystal layer LC, as a result displaying the image.

Although not shown in figures, a backlight unit is disposed at the rear side of the display panel 100 to provide light to the display panel 100.

In an exemplary embodiment, the storage line is applied with a storage voltage having a constant level, but should not be limited thereto or thereby. In an exemplary embodiment, the storage line may receive the common voltage. The storage capacitor Cst compensates for the voltage charged in the liquid crystal capacitor Clc.

Figure 3:
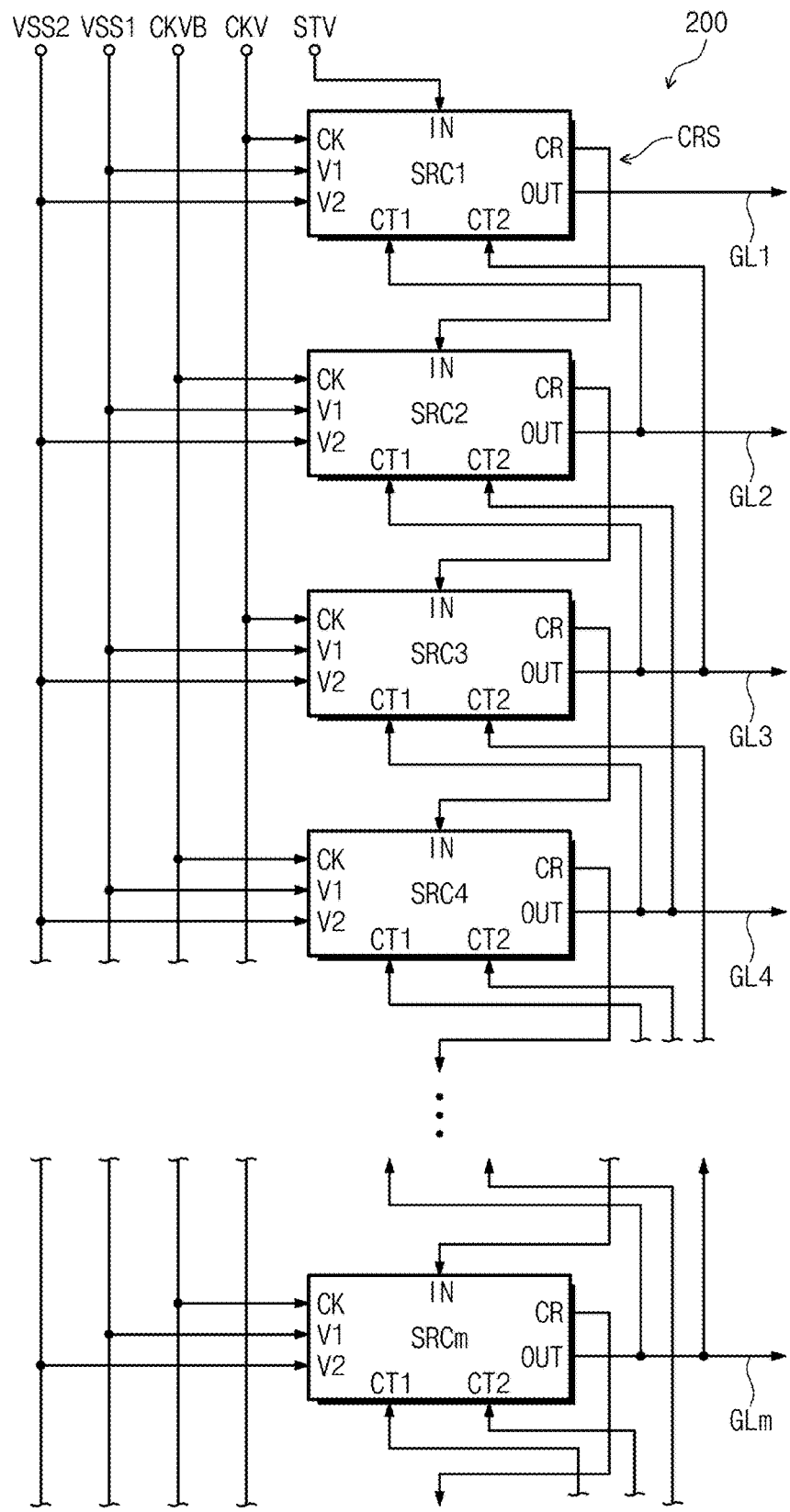
FIG. 3 is a block diagram showing an exemplary embodiment of a structure of a gate driver shown in FIG. 1.

FIG. 3 is a diagram showing an exemplary embodiment of a structure of the gate driver 200 shown in FIG. 1.

Referring to FIG. 3, the gate driver 200 includes a plurality of stages SRC1 to SRCm connected to each other one after another. The stages SRC1 to SRCm are electrically connected to the gate lines GL1 to GLm and sequentially output gate signals.

Each of the stages SRC1 to SRCm includes an input terminal IN, a clock terminal CK, a first voltage terminal V1, a second voltage terminal V2, a first control terminal CT1, a second control terminal CT2, an output terminal OUT, and a carry terminal CR.

In an exemplary embodiment, the gate control signal includes a start signal STV, a first clock signal CKV, and a second clock signal CKVB. The first clock signal CKV has a phase opposite to that of the second clock signal CKVB.

The carry terminal CR of each of the stages SRC1 to SRCm is electrically connected to the input terminal IN of a next stage. In an exemplary embodiment, the carry terminal CR of an i-th stage is electrically connected to the input terminal IN of an (i+1)th stage. Here, "i" is an integer number greater than 0 and equal to or smaller than m−2.

A first stage SRC1, of the stages SRC1 to SRCm, receives the start signal STV. The input terminal IN of each of the second to m-th stages SRC2 to SRCm receives the carry signal CRS output from the carry terminal CR of a previous stage, except for the input terminal IN of the first stage SRC1.

Among the stages SRC1 to SRCm, odd-numbered stages SRC1, SRC3, . . . , SRCm−1 are applied with a clock signal having a phase opposite to that of a clock signal applied to the even-numbered stages SRC2, SRC4, . . . , SRCm. In an exemplary embodiment, the odd-numbered stages SRC1, SRC3, . . . , SRCm−1 are applied with the first clock signal CKV and the even-numbered stages SRC2, SRC4, . . . , SRCm are applied with the second clock signal CKVB.

The first voltage terminal V1 of each of the stages SRC1 to SRCm are applied with a first voltage VSS1 (or a first low voltage). The second voltage terminal V2 of each of the stages SRC1 to SRCm are applied with a second voltage VSS2 (or a second low voltage).

The second voltage VSS2 has a voltage level smaller than that of the first voltage VSS1. The first voltage VSS1 is a ground voltage or a negative voltage. In an exemplary embodiment, the first voltage VSS1 may be about −6 volts (V) and the second voltage VSS2 may be about −10V.

In an exemplary embodiment, the first control terminal CT1 of the i-th stage is connected to the output terminal OUT of the (i+1)th stage. The second control terminal CT2 of the i-th stage is connected to the output terminal OUT of an (i+2)th stage.

The first control terminal CT1 of the i-th stage is applied with the gate signal output from the output terminal OUT of the (i+1)th stage. The second control terminal CT2 of the i-th stage is applied with the gate signal output from the output terminal OUT of the (i+2)th stage.

The start signal STV or the carry signal CRS applied to the input terminal IN and the gate signals respectively applied to the first and second control terminals CT1 and CT2 are used to control an operation of the stages SRC1 to SRCm.

The first and second control terminals CT1 and CT2 of a last stage SRCm of the stages SRC1 to SRCm are applied with signals corresponding to the gate signals from dummy stages (not shown). The dummy stages are not substantially connected to the gate lines GL1 to GLm.

The output terminal OUT of each of the stages SRC1 to SRCm is connected to a corresponding gate line of the gate lines GL1 to GLm. The output terminals OUT of the stages SRC1 to SRCm sequentially output the gate signals through the gate lines GL1 to GLm.

In an exemplary embodiment, a high level of the first and second clock signals CKV and CKVB corresponds to a gate-on voltage to drive the pixels, and a low level of the first and second clock signals CKV and CKVB corresponds to a gate-off voltage. The output terminal OUT of each of the stages SRC1 to SRCm outputs the clock signal having a high level, which is applied to the clock terminal CK.

The carry terminal CR of each of the stages SRC1 to SRCm outputs the carry signal CRS having the same phase and size as those of the corresponding gate signal.

Figure 4:
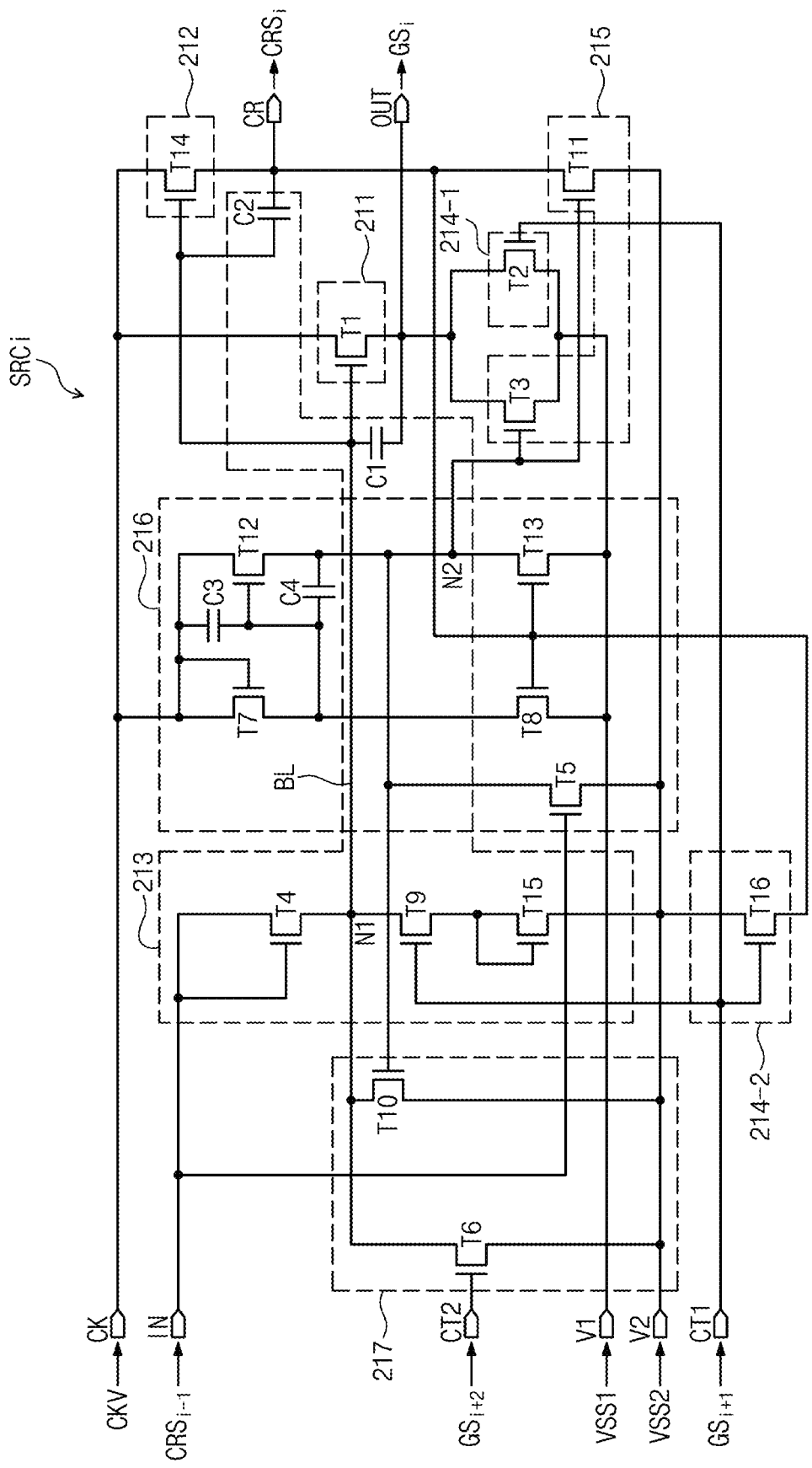
FIG. 4 is a circuit diagram showing an exemplary embodiment of an i-th stage of stages shown in FIG. 3.

FIG. 4 is a circuit diagram showing an exemplary embodiment of the i-th stage of the stages shown in FIG. 3.

FIG. 4 shows an exemplary embodiment of the circuit diagram of the i-th stage SRCi as a representative example. Since the other stages shown in FIG. 3 have the same circuit configuration as that of the i-th stage SRCi, the circuit configuration of the i-th stage SRCi will be described in detail and the other stages will be omitted.

Referring to FIG. 4, an exemplary embodiment of the i-th stage SRCi includes the first to sixteenth transistors T1 to T16 connected to each other and to the first to fourth capacitors C1 to C4 in order to generate the gate signal.

In addition, the i-th stage SRCi includes a first output part 211, a second output part 212, a controlling part 213, a first pull-down part 214-1, a second pull-down part 214-2, a holding part 215, a switching part 216, and a stabilizing part 217, which are defined depending on functions of the first to sixteenth transistors T1 to T16.

In an exemplary embodiment, the first clock part 211 receives the first clock signal CKV and outputs the gate signal GSi to an i-th gate line (not shown) in response to the control of the controlling part 213. The second output part 212 receives the first clock signal CKV and applies the carry signal CRSi to the (i+1)th stage (not shown) in response to the control of the controlling part 213.

The controlling part 213 controls an operation of the first and second output parts 211 and 212. In an exemplary embodiment, the controlling part 213 turns on the first and second output parts 211 and 212 in response to the carry signal CRSi−1 of an (i−1)th stage (not shown). The controlling part 213 turns off the first and second output parts 211 and 212 in response to the gate signal GSi+1 of the (i+1)th stage.

In an exemplary embodiment, the first pull-down part 214-1 lowers an electric potential of the output terminal OUT to the first voltage VSS1. The second pull-down part 214-2 lowers an electric potential of the carry terminal CR to the second voltage VSS2. The holding part 215 holds the gate signal GSi to the first voltage VSS1 and holds the carry signal CRSi to the second voltage VSS2 during the turn-off period of the first output part 211.

In an exemplary embodiment, the switching part 216 controls the on/off operation of the holding part 215. A second node N2 corresponds to an output terminal of the switching part 216 and is connected to the control terminals of the holding part 215. The stabilizing part 217 stabilizes an electric potential of a first node N1 during a low period of the gate signal GSi.

In an exemplary embodiment, the first output part 211 includes a first transistor T1. The first transistor T1 includes an input electrode which is applied with the first clock signal CKV, a control electrode which is connected to the controlling part 213, and an output electrode which outputs the gate signal GSi. The control electrode of the first transistor T1 is connected to the first node N1, which serves as an output terminal of the controlling part 213.

In an exemplary embodiment, the second output part 212 includes a fourteenth transistor T14. The fourteenth transistor T14 includes an input electrode which is applied with the first clock signal CKV, a control electrode which is connected to the control electrode of the first transistor T1, and an output electrode which outputs the carry signal CRSi.

In an exemplary embodiment, the controlling part 213 includes a fourth, ninth, and fifteenth transistor T4, T9, and T15 and a first and second capacitor C1 and C2. The fourth transistor T4 includes an input electrode and a control electrode, which commonly receives the carry signal CRSi−1 of the (i−1)th stage, and an output electrode which is connected to the control electrodes of the first and fourteenth transistors T1 and T14 through the first node N1. The carry signal CRSi−1 of the (i−1)th stage serves as a switching control signal of the fourth transistor T4.

The ninth transistor T9 includes an output electrode connected to the first node N1, a control electrode which receives the gate signal GSi+1 of the (i+1)th stage, and an input electrode. The fifteenth transistor T15 includes a control electrode and an output electrode, which are commonly connected to the input electrode of the ninth transistor T9, and an input electrode connected to the second voltage terminal V2.

The first capacitor C1 is connected between the control electrode and the output electrode of the first transistor T1. The second capacitor C2 is connected between the control electrode and the output electrode of the fourteenth transistor T14.

When the fourth transistor T4 is turned on in response to the carry signal CRSi−1 of the (i−1)th stage, the electric potential of the first node N1 increases to a first high voltage, turning on the first and fourteenth transistors T1 and T14.

When the carry signal CRSi−1 of the (i−1)th stage is applied to the first node N1, the first capacitor C1 is charged. Then, the first transistor T1 is bootstrapped. In an exemplary embodiment, the first node N1 connected to the control electrode of the first transistor T1 is boosted from the first high voltage to a second high voltage. In an exemplary embodiment, the second high voltage of the first node N1 may be about 30V. Hereinafter, a line where the first node N1 is disposed is referred to as a boosting line BL.

When the ninth and fifteenth transistors T9 and T15 are turned on in response to the gate signal GSi+1 of the (i+1)th stage, the electric potential of the first node N1 decreases. In an exemplary embodiment, the electric potential of the first node N1 is relatively higher than the second voltage VSS2 due to an influence of the fifteenth transistor T15. When the electric potential of the first node N1 decreases, the first and fourteenth transistors T1 and T14, which are connected to the first node N1, are turned off.

In an exemplary embodiment, the first pull-down part 214-1 includes a second transistor T2. The second transistor T2 includes an output electrode connected to the output electrode of the first transistor T1, a control electrode receiving the gate signal GSi+1 of the (i+1)th stage, and an input electrode connected to the first voltage terminal V1. The second transistor T2 lowers the electric potential of the output terminal OUT to the first voltage VSS1 in response to the gate signal GSi+1 of the (i+1)th stage.

In an exemplary embodiment, the second pull-down part 214-2 includes a sixteenth transistor T16. The sixteenth transistor T16 includes a control electrode receiving the gate signal GSi+1 of the (i+1)th stage, an input electrode connected to the second voltage terminal V2, and an output electrode connected to the output electrode of the fourteenth transistor T14. The sixteenth transistor T16 lowers the electric potential of the carry terminal CR to the second voltage VSS2 in response to the gate signal GSi+1 of the (i+1)th stage.

In an exemplary embodiment, the holding part 215 includes a third and eleventh transistor T3 and T11. The third transistor T3 includes an output electrode connected to the output electrode of the first transistor T1, a control electrode connected to the second node N2, and an input electrode connected to the first voltage terminal V1.

The eleventh transistor T11 includes an output electrode connected to the output electrode of the fourteenth transistor T14, a control electrode connected to the second node N2, and an input electrode connected to the second voltage terminal V2.

The third transistor T3 holds the electric potential of the output terminal OUT to the first voltage VSS1 during the turn-off period of the first transistor T1. The eleventh transistor T11 holds the electric potential of the carry terminal CR to the second voltage VSS2 during the turn-off period of the fourteenth transistor T14.

The switching part 216 applies the second voltage VSS2 to the second node N2 in response to the carry signal CRSi−1 of the (i−1)th stage during the turn-on period of the first output part 211. The holding part 215 turns off when the second voltage VSS2 is applied. Then, the switching part 216 applies the first voltage VSS1 to the second node N2 in response to the first clock signal CKV. The holding part 215 maintains the turn-off state when the first voltage VSS1 is applied.

The switching part 216 applies a voltage corresponding to the first clock signal CKV to the second node N2 during the turn-off period of the first output part 211. In an exemplary embodiment, during the turn-off period of the first output part 211, the first voltage VSS1 and a third high voltage corresponding to the high level of the first clock signal CKV are alternately applied to the second node N2. When the third high voltage is applied to the second node N2 during the turn-off period of the first output part 211, the holding part 215 is turned on.

In an exemplary embodiment, the switching part 216 includes a fifth, seventh, eighth, twelfth, thirteenth transistor T5, T7, T8, T12, and T13 and a third and fourth capacitor C3 and C4. The fifth transistor T5 includes a control electrode applied with the carry signal CRSi−1 of the (i−1)th stage, an output electrode connected to the second node N2, and an input electrode connected to the second voltage terminal V2.

The seventh transistor T7 includes an input electrode and a control electrode, which commonly receive the first clock signal CKV. The seventh transistor T7 also includes an output electrode connected to an output electrode of the eighth transistor T8. The eighth transistor T8 includes a control electrode connected to the output electrode of the sixteenth transistor T16, an input electrode connected to the first voltage terminal V1, and an output electrode.

The twelfth transistor T12 includes an input electrode receiving the first clock signal CKV, a control electrode connected to the output electrode of the seventh transistor T7, and an output electrode connected to the second node N2.

The thirteenth transistor T13 includes a control electrode receiving the carry signal CRSi from the second output part 212 and is connected to the output electrode of the sixteenth transistor T16, an output electrode connected to the control electrode of the third transistor T3, and an input electrode connected to the first voltage terminal V1.

The third capacitor C3 is connected between the input electrode and the control electrode of the twelfth transistor T12. The fourth capacitor C4 is connected between the output electrode of the seventh transistor T7 and the output electrode of the twelfth transistor T12.

The fifth transistor T5 applies the second voltage VSS2 to the second node N2 in response to the carry signal CRSi−1 of the (i−1)th stage. The thirteenth transistor T13 applies the first voltage VSS1 to the second node N2 during the turn-on period of the second output part 212. In an exemplary embodiment, the third and eleventh transistors T3 and T11 are turned off by the first voltage VSS1 during the turn-on period of the second output part 212.

The eighth transistor T8 is turned on during the turn-on period of the second output part 212 to lower the first clock signal CKV output from the seventh transistor T7 to the first voltage VSS1. As a result, the first clock signal CKV may not be applied to the second node N2. The turn-on period of the second output part 212 corresponds to the high period of the first clock signal CKV.

The third and fourth capacitors C3 and C4 are charged with a voltage in accordance with the first clock signal CKV. Then, the twelfth transistor T12 is turned on by the voltage charged in the third and fourth capacitors C3 and C4. In addition, when the fifth, eighth, and thirteenth transistors T5, T8, and T13 are turned off, the electric potential of the second node N2 increases by the voltage charged in the third and fourth capacitors C3 and C4.

When the electric potential of the second node N2 increases, the third and eleventh transistors T3 and T11 are turned on, and the output terminal OUT and the carry terminal CR are respectively held to the first voltage VSS1 and the second voltage VSS2 by the turned-on third and eleventh transistors T3 and T11.

In an exemplary embodiment, the stabilizing part 217 includes a sixth and tenth transistor T6 and T10. The sixth transistor T6 includes a control electrode receiving the gate signal GSi+2 of the (i+2)th stage (not shown), an input electrode connected to the second voltage terminal V2, and an output electrode connected to the first node N1. The tenth transistor T10 includes a control electrode connected to the second node N2, an input electrode connected to the second voltage terminal V2, and an output electrode connected to the first node N1.

The sixth transistor T6 applies the second voltage VSS2 to the first node N1 in response to the gate signal GSi+2 of the (i+2)th stage. In an exemplary embodiment, the electric potential of the first node N1 may be stabilized to the second voltage VSS2 by the gate signal GSi+2 of the (i+2)th stage.

The tenth transistor T10 is turned on or turned off in accordance with the electric potential of the second node N2. When the electric potential of the second node N2 is lowered to the first voltage VSS1, the tenth transistor T10 is turned off. When the electric potential of the second node N2 increases by the first clock signal CKV, the tenth transistor T10 is turned on. The turned-on tenth transistor T10 lowers the electric potential of the first node N1 to the second voltage VSS2.

In an exemplary embodiment, the electric potential of the first node N1 is stabilized to the second voltage VSS2 by the sixth and tenth transistors T6 and T10 during the low period of the gate signal GSi.

Figure 5:
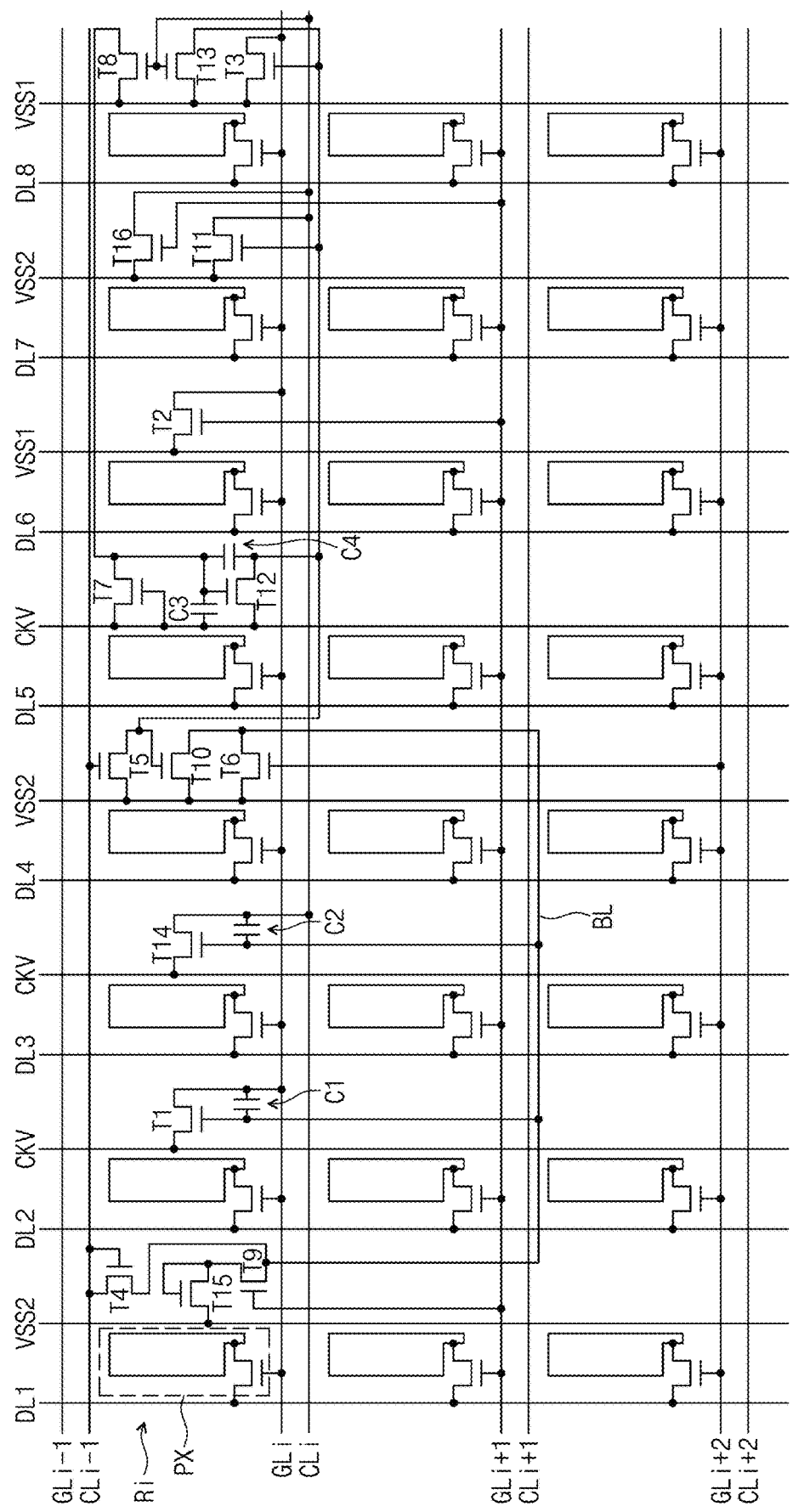
FIG. 5 is a circuit diagram showing an exemplary embodiment of arrangements of the first to sixteenth transistors shown in FIG. 4 and pixels.

FIG. 5 is a diagram showing an exemplary embodiment of the first to sixteenth transistors shown in FIG. 4 related to a plurality of pixels.

For the convenience of explanation, FIG. 5 shows an exemplary embodiment of the first to sixteenth transistors T1 to T16 of the i-th stage. In addition, FIG. 5 shows arbitrary pixels PX of the pixels PX11 to PXmn and the gate lines GLi−1 to GLi+2 and the data lines DL1 to DL8 connected to the pixels PX.

Referring to FIG. 5, the pixels PX are arranged in a matrix configuration. Each of the pixels PX are connected to a corresponding gate line of the gate lines GLi−1 to GLi+2 and a corresponding data line of the data lines DL1 to DL8.

Carry lines CLi−1 to CLi+2 corresponding to the gate lines GLi−1 to GLi+2 are disposed on the display panel 100. The carry lines CLi−1 to CLi+2 extend in the first direction DR1 and are substantially parallel to the gate lines GLi−1 to GLi+2. The number of the carry lines CLi−1 to CLi+2 is substantially the same as the number of the gate lines GLi−1 to GLi+2. The carry lines CLi−1 to CLi+2 are disposed to correspond to the gate lines GLi−1 to GLi+2 in a one-to-one correspondence.

In the present exemplary embodiment, four carry lines CLi−1 to CLi+2 are shown in FIG. 5. However, since the number of the gate lines GL1 to GLm is "m" in the invention, m carry lines may be disposed on the display panel 100. Each of the m carry lines is connected to the carry terminal CR of a corresponding stage of the stages SRC1 to SRCm. The carry lines CLi−1 to CLi+2 receive the carry signal CRS.

The first output part 211, the second output part 212, the controlling part 213, the first pull-down part 214-1, the second pull-down part 214-2, the holding part 215, the switching part 216, and the stabilizing part 217 of each of the stages SRC1 to SRCm are disposed between the pixels arranged in a corresponding row of the rows.

In an exemplary embodiment, the first output part 211, the second output part 212, the controlling part 213, the first pull-down part 214-1, the second pull-down part 214-2, the holding part 215, the switching part 216, and the stabilizing part 217 of the i-th stage SRCi are disposed between the pixels PX arranged in an i-th row Ri. In an exemplary embodiment, the first to sixteenth transistors T1 to T16 of the i-th stage SRCi are disposed between the pixels PX arranged in the i-th row Ri.

Lines receiving the first clock signal CKV (or the second clock signal CKVB), the first voltage VSS1, and the second voltage VSS2 are disposed between the pixels PX and extend in the second direction DR2, which is substantially parallel to the data lines DL1 to DL8.

Since the connection structures of the first to sixteenth transistors T1 to T16 and the first to fourth capacitors C1 to C4 are as described with reference to FIG. 4, details thereof will be omitted.

The fourth, ninth, and fifteenth transistors T4, T9, T15 are disposed between a first pixel PX and a second pixel PX in the first direction DR1. The first transistor T1 is disposed between the second pixel PX and a third pixel PX in the first direction DR1.

The fourteenth transistor T14 is disposed between the third pixel PX and a fourth pixel PX in the first direction DR1. The fifth, sixth, and tenth transistors T5, T6, and T10 are disposed between the fourth pixel PX and a fifth pixel PX in the first direction DR1.

The seventh and twelfth transistors T7 and T12 are disposed between the fifth pixel PX and a sixth pixel PX in the first direction DR1. The second transistor T2 is disposed between the sixth pixel PX and a seventh pixel PX in the first direction DR1.

The eleventh and sixteenth transistors T11 and T16 are disposed between the seventh pixel PX and an eighth pixel PX in the first direction DR1. The eighth, third, and thirteenth transistors T8, T3, and T13 are disposed between the eighth pixel PX and a ninth pixel (not shown) in the first direction DR1.

Lines receiving the first clock signal CKV are disposed between the second pixel PX and the third pixel PX, between the third pixel PX and the fourth pixel PX, and between the fifth pixel PX and the sixth pixel PX and substantially extend in the second direction DR2.

Lines receiving the first voltage VSS1 are disposed between the sixth pixel PX and the seventh pixel PX and between the eighth pixel PX and the ninth pixel PX and substantially extend in the second direction DR2.

Lines receiving the second voltage VSS2 are disposed between the first pixel PX and the second pixel PX, between the fourth pixel PX and the fifth pixel PX, and between the seventh pixel PX and the eighth pixel PX and substantially extend in the second direction DR2.

The structure of the first to sixteenth transistors T1 to T16, the first capacitor C1 and the lines receiving the first clock signal CKV, the first voltage VSS1, and the second voltage VSS2 shown in FIG. 5 is a representative example of the invention. In an exemplary embodiment, the structure of the first to sixth transistors T1 to T16, the first capacitor C1, and the lines receiving the first clock signal CKV, the first voltage VSS1, and the second voltage VSS2 may be changed in various ways.

In the present exemplary embodiment, since the first to sixteenth transistors T1 to T16 of the gate driver 200 are disposed on the display area DA, the narrow bezel of the display apparatus 500 is realized.

The control electrode of the first transistor T1, the output electrode of the fourth transistor T4, the output electrode of the sixth transistor T6, the output electrode of the ninth transistor T9, the output electrode of the tenth transistor T10, and the control electrode of the fourteenth transistor T14 are connected to the boosting line BL.

The boosting line BL, which drives the gate line connected to a present stage, is disposed adjacent to the gate line connected to one of the next stages. In an exemplary embodiment, the boosting line BL of the i-th stage SRCi is disposed adjacent to the (i+1)th gate line GLi+1 as shown in FIG. 5.

In more detail, the boosting line BL of the i-th stage SRCi is disposed between the (i+1)th gate line GLi+1 connected to the (i+1) stage and the carry line (CLi+1) of the (i+1)th stage SRCi+1.

Although not shown in figures, in another exemplary embodiment, the boosting line BL of the i-th stage SRCi may be disposed under the (i+1)th carry line CLi+1 of the (i+1)th stage SRCi+1. In addition, the boosting line BL of the i-th stage SRCi may be disposed adjacent to the gate line disposed farther than the (i+1)th gate line GLi+1.

The i-th gate signal is applied to the i-th gate line GLi in accordance with the operation of the first to sixteenth transistors T1 to T16 of the i-th stage SRCi. The i-th gate signal is applied to the pixels PX arranged in the i-th row Ri (or the present stage) through the i-th gate line GLi. Thus, the pixels PX arranged in the i-th row Ri are driven.

In an exemplary embodiment, the boosting line BL, which drives the present gate line, is disposed adjacent to the present gate line or to be overlapped with the pixels PX connected to the present gate line. As described above, the boosting line BL is boosted to the second high voltage, where the second high voltage may be about 30V.

As a result, when the pixels PX of the present stage are driven, the second high voltage of the boosting line BL, which drives the present gate line, may exert an influence on the driving of the liquid crystal molecules of the pixels PX of the present stage. In an exemplary embodiment, when the pixels PX of the present stage are driven, the liquid crystal molecules of the pixels PX of the present stage may be abnormally driven due to the second high voltage of the boosting line BL driving the present gate line. As a result, the image may be displayed abnormally.

However, in the present exemplary embodiment of the invention, the boosting line BL that drives the present gate line is disposed adjacent to the gate line of the next stage or the stage farther than the next stage. In an exemplary embodiment, the boosting line BL driving the i-th gate line GLi is disposed farther from the i-th gate line GLi and disposed adjacent to the (i+1)th gate line GLi+1.

As described above, when the pixels PX arranged in the i-th row Ri, which corresponds to the present stage, are driven, the second high voltage of the boosting line BL driving the i-th gate line GLi does not exert influence on the driving of the liquid crystal molecules of the pixels PX arranged in the i-th row Ri. As a result, the image is displayed normally.

Consequently, the display apparatus 500 according to the invention may realize the narrow bezel and display the image normally.

Although the exemplary embodiments of the invention have been described herein, it is understood that the invention should not be limited to these exemplary embodiments but various changes and modifications may be made by one ordinary skilled in the art within the spirit and scope of the invention as hereinafter claimed.

What is claimed is:

1. A gate driver comprising:
a plurality of stages respectively connected to gate lines to output gate signals, each of the plurality of stages comprises:
   a controlling part which increases an electric potential of a boosting line of a present stage of the plurality of stages in response to a carry signal of a previous stage of the plurality of stages and decreases the electric potential of the boosting line of the present stage in response to a carry signal of a next stage of the plurality of stages;
   a first output part which turns on in response to the increased electric potential of the boosting line of the present stage and receives a clock signal to output a gate signal of the present stage among the gate signals; and
   a second output part which turns on in response to the increased electric potential of the boosting line and receives the clock signal to output a carry signal of the present stage,
wherein a portion of the boosting line of the present stage is disposed closer to a gate line of the gate lines which is connected to an output terminal of one stage of the plurality of stages following the present stage than to a gate line of the gate lines which is connected to an output terminal of the present stage.

2. The gate driver of claim 1, wherein the controlling part of a first stage of the plurality of stages is applied with a start signal to increase the electric potential of the boosting line of the present stage.

3. The gate driver of claim 1, wherein the portion of the boosting line of the present stage is disposed closer to a gate line which is connected to the next stage than to the gate line of the gate lines which is connected to the present stage.

4. The gate driver of claim 1, further comprising a plurality of carry lines disposed to correspond to the gate lines in a one-to-one correspondence to output a carry signal from one stage of the plurality of stages to the next stage of the plurality of stages.

5. The gate driver of claim 4, wherein the plurality of carry lines is substantially extended in parallel to the gate lines.

6. The gate driver of claim 4, wherein the boosting line of the present stage is disposed between a gate line which is connected to the next stage and a carry line of the next stage among the plurality of carry lines.

7. The gate driver of claim 4, wherein the boosting line of the present stage is disposed under a carry line of the next stage among the plurality of carry lines.

8. The gate driver of claim 1, wherein each of the plurality of stages further comprises:
   a first pull-down part which decreases an electric potential of the output terminal of the each of the plurality of stages, wherein the output terminal outputs the gate signal of the present stage to a first voltage in response to a gate signal of the next stage among the gate signals;
   a second pull-down part which decreases an electric potential of a carry terminal of the each of the plurality of stages, wherein the carry terminal outputs the carry signal of the present stage to a second voltage, which is lower than the first voltage, in response to the gate signal of the next stage;
   a holding part which holds the gate signal of the present stage to the first voltage and holds the carry signal of the present stage to the second voltage during a turn-off period of the first output part;
   a switching part which controls an on/off operation of the holding part; and
   a stabilizing part which stabilizes the electric potential of the boosting line of the present stage during a low period of the gate signal of the present stage.

9. The gate driver of claim 8, wherein the plurality of stages is further connected to a plurality of lines which receives the first voltage, the second voltage, and the clock signal, wherein the plurality of lines extends in a direction which crosses a direction in which the gate lines extend.

10. A display apparatus comprising:
a display panel comprising a display area, in which pixels are disposed and connected to gate lines and data lines, wherein the data lines cross the gate lines, and a non-display area surrounding the display area; and
a gate driver comprising a plurality of stages respectively connected to the gate lines to output gate signals, and disposed on the display area, wherein each of the plurality of stages comprises:
   a controlling part which increases an electric potential of a boosting line of a present stage of the plurality of stages in response to a carry signal of a previous stage of the plurality of stages and decreases the electric potential of the boosting line of the present stage in response to a carry signal of a next stage of the plurality of stages;
   a first output part which turns on in response to the increased electric potential of the boosting line of the present stage and receives a clock signal to output a gate signal of the present stage among the gate signals; and
   a second output part which turns on in response to the increased electric potential of the boosting line of the present stage and receives the clock signal to output a carry signal of the present stage,
wherein a portion of the boosting line of the present stage is disposed closer to a gate line of the gate lines which is connected to an output terminal of one stage of the plurality of stages following the present stage than to a gate line of the gate lines which is connected to an output terminal of the present stage, and the controlling part of a first stage of the plurality of stages is applied with a start signal to increase the electric potential of the boosting line of the present stage.

11. The display apparatus of claim 10, wherein the portion of the boosting line of the present stage is disposed closer to the gate line, which is connected to the next stage than to a gate line of the gate lines which is connected to the present stage.

12. The display apparatus of claim 10, further comprising a plurality of carry lines disposed to correspond to the gate lines in a one-to-one correspondence to output the carry signal from the present stage to the next stage.

13. The display apparatus of claim 12, wherein the carry lines are substantially extended in parallel to the gate lines.

14. The display apparatus of claim 12, wherein the boosting line of the present stage is disposed between a gate line, which is connected to the next stage, among the gate lines and a carry line of the next stage among the carry lines.

15. The display apparatus of claim 12, wherein the boosting line of the present stage is disposed under a carry line of the next stage among the carry lines.

16. The display apparatus of claim 10, wherein each of the plurality of stages further comprises:
   a first pull-down part which decreases an electric potential of the output terminal of each of the plurality of stages, wherein the output terminal outputs the gate signal of the present stage to a first voltage in response to the gate signal of the next stage;

a second pull-down part which decreases an electric potential of a carry terminal of each of the plurality of stages, wherein the carry terminal outputs the carry signal of the present stage to a second voltage, which is lower than the first voltage, in response to a gate signal of the next stage among the gate signals;

a holding part which holds the gate signal of the present stage to the first voltage and holds the carry signal of the present stage to the second voltage during a turn-off period of the first output part;

a switching part which controls an on/off operation of the holding part; and a stabilizing part which stabilizes the electric potential of the boosting line of the present stage during a low period of the gate signal of the present stage.

17. The display apparatus of claim 16, wherein the first output part, the second output part, the controlling part, the first pull-down part, the second pull-down part, the holding part, the switching part, and the stabilizing part of each of the plurality of stages are disposed between at least two pixels of the pixels arranged in a corresponding row among a plurality of rows.

18. The display apparatus of claim 16, wherein the plurality of stages of the gate driver is further connected to a plurality of lines which receives the first voltage, the second voltage, and the clock signal, wherein the plurality of lines extends in a direction which crosses a direction in which the gate lines extend.

19. The display apparatus of claim 10, wherein the plurality of stages is disposed in an area of one side of the display area.

* * * * *